United States Patent
Tsai et al.

(10) Patent No.: US 9,412,671 B1
(45) Date of Patent: Aug. 9, 2016

(54) METHOD FOR CONTROLLING PROCESSING TEMPERATURE IN SEMICONDUCTOR FABRICATION

(71) Applicant: Taiwan Semiconductor Manufacturing Co., Ltd, Hsin-Chu (TW)

(72) Inventors: Hsien-Chie Tsai, Taichung (TW);
Chang-Sheng Lee, Hsinchu (TW);
Fu-Yuan Chang, Taichung (TW);
Hung-Yin Lin, Taichung (TW);
Wen-Che Chang, Taichung (TW);
Chien-Pin Hsu, Taichung (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/700,557

(22) Filed: Apr. 30, 2015

(51) Int. Cl.
*H01L 21/66* (2006.01)
*H01L 21/30* (2006.01)
*H01L 21/3065* (2006.01)
*H01L 21/324* (2006.01)

(52) U.S. Cl.
CPC ............ *H01L 22/12* (2013.01); *H01L 21/3065* (2013.01); *H01L 21/324* (2013.01)

(58) Field of Classification Search
CPC .......................... H01L 21/3065; H01L 21/324
See application file for complete search history.

(56) References Cited

U.S. PATENT DOCUMENTS

| 6,153,849 A | 11/2000 | Yung et al. |
| 6,334,311 B1 * | 1/2002 | Kim ........................ F25B 21/02 62/3.2 |
| 2016/0079101 A1 * | 3/2016 | Yanai ................ H01L 21/67248 438/706 |

* cited by examiner

*Primary Examiner* — Mamadou Diallo
(74) *Attorney, Agent, or Firm* — McClure, Qualey & Rodack, LLP

(57) ABSTRACT

A method for controlling processing temperature in semiconductor fabrication is provided. The method includes detecting temperature in a first chamber configured to process a semiconductor wafer. The method further includes creating a flow of heat-exchange medium in a second chamber which is connected to the first chamber to cool the first chamber. The method also includes controlling the flow of heat-exchange medium according to the temperature detected in the first chamber by changing a covered area of a first ventilation unit which allows the entry of the heat-exchange medium to the second chamber.

20 Claims, 7 Drawing Sheets

METHOD FOR CONTROLLING PROCESSING TEMPERATURE IN SEMICONDUCTOR FABRICATION

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of materials over a semiconductor substrate, and patterning the various material layers using lithography to form an integrated circuit (IC) and elements thereon. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

During the manufacturing of semiconductor devices, various processing steps are used to fabricate integrated circuits on a semiconductor wafer. One of the difficult factors in the continuing evolution toward smaller device sizes and higher density has been the ability to consistently form small critical dimensions within predetermined error windows. For example, semiconductor feature sizes are frequently subjected to optical or electrical metrology inspections following photolithographic patterning and etching to ensure that critical dimensions are within acceptable limits.

Although existing methods and devices for operating the processing steps have been generally adequate for their intended purposes, they have not been entirely satisfactory in all respects. Consequently, it would be desirable to provide a solution for process control in semiconductor manufacturing operations.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
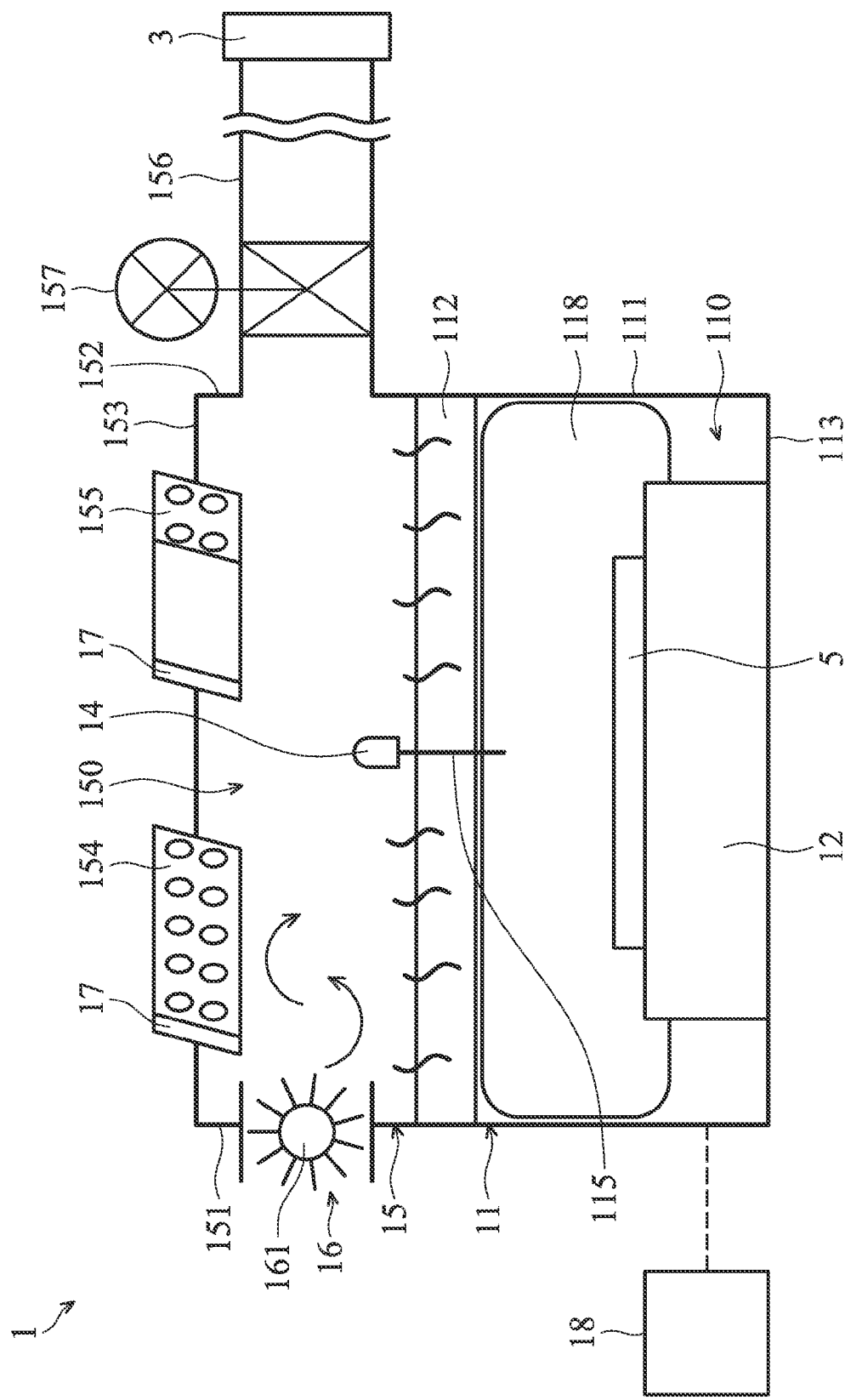
FIG. 1 is a schematic diagram of a processing apparatus in semiconductor fabrication, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIG. 1 is a schematic diagram of a processing apparatus 1 for processing a semiconductor wafer 5 in a semiconductor fabrication, in accordance with some embodiments. In some embodiments, the processing apparatus 1 includes a first chamber 11, a wafer holding stage 12, an inductive coil 13, a thermocouple probe 14, a second chamber 15, a fan assembly 16, one or more covering modules 17, and a controller 18. The elements of the processing apparatus 1 can be added to or omitted, and the disclosure should not be limited by the embodiments.

In some embodiments, the first chamber 11 is a plasma etch chamber which is configured to perform a plasma etching process. In the first chamber 11, the plasma source is a transformer coupled plasma (TCP) source which generates high-density, low-pressure plasma 118 decoupled from the semiconductor wafer 5.

In some embodiments, the first chamber 11 includes a side plate 111, a dielectric plate (or transformer coupled plasma (TCP) window) 112, and a bottom plate 113. The side plate 111 is connected to the bottom plate 113 and extends away from the bottom plate 113. The TCP window 112 is positioned on top of the first chamber 11 and is connected to the side plate 111. An interior 110 of the first chamber 11 is defined by the side plate 111, the bottom plate 113 and the TCP window. The TCP window 112 includes a quartz material or another suitable material.

In some embodiments, a through hole 115 is formed at the center of the TCP window 112. The thermocouple probe 14 is positioned in the through hole 115 to detect temperature of the TCP window 112 or the temperature in the first chamber 11. However, it should be appreciated that many variations and modifications can be made to embodiments of the disclosure. The thermocouple probe 14 can be positioned in any suitable position in the first chamber 11. In some other embodiments, the thermocouple probe 14 is omitted.

In some embodiments, the inductive coil 13 is positioned over the TCP window 112. The inductive coil 13 may include a flat spiral coil. In some embodiments, as shown in FIG. 1, the inductive coil 13 is separated from the plasma 118 by the TCP window 112. The inductive coil 13 is coupled to an RF power source (not shown). Alternatively, a matching network (not shown) may be coupled between the inductive coil 13 and RF power source for matching impedances and increasing efficiency.

In some embodiments, the wafer holding stage 12 is disposed underneath the plasma 118 generated in the first chamber 11. The wafer holding stage 12 is used to hold the semiconductor wafer 5 during the plasma etching process. When the semiconductor wafer 5 is positioned on the wafer holding stage 12.

In some embodiments, the wafer holding stage 12 includes an electrostatic chuck (ESC) for securing a semiconductor wafer 5. The wafer holding stage 12 may be coupled to a radio frequency (RF) power source (not shown) for biasing the semiconductor wafer 5, which helps direct charged plasma radix or ions toward the wafer during processing. Alternatively, a matching network (not shown) may optionally be coupled between the wafer holding stage 12 and the RF power source.

In some embodiments, the processing apparatus 1 also includes a gas supply (not shown) for providing a gas in the first chamber 11 and a vacuum system (not shown) for maintaining an operating pressure in the first chamber 11. In some embodiments, the processing apparatus 1 further includes a number of multi-pole magnets positioned at the side panel 111 and surrounding the interior 110.

The second chamber 15 is connected to the first chamber 11 and is configured to dissipate heat from the first chamber 11. In some embodiments, the second chamber 15 includes a number of side walls, such as side walls 151 and 152, and a top wall 153. The side walls 151 and 152 connect the first chamber 11 to the top wall 153. In some embodiments, the second chamber 15 is built to completely enclose the TCP window 112 of the first chamber 11.

As shown in FIG. 1, an interior 150 is defined by the side walls 151 and 152, the top wall 153, and the TCP window 112. The interior 150 is secluded from the interior 110 of the first chamber 11 by the TCP window 112. However, it should be appreciated that many variations and modifications can be made to embodiments of the disclosure. In some embodiments, at least a portion of the side wall 111 of the first chamber 11 is surrounded by the second chamber 15. The side wall 111 cooperatively defines the interior 150 of the second chamber 15.

In some embodiments, the second chamber 15 further includes a number of ventilation units, such as ventilation units 154 and 155. Each of the ventilation units 154 and 155 includes a plurality of holes for allowing gas or air to enter the interior 150 of the second chamber 15 by a natural convection effect. In some embodiments, the ventilation units 154 and 155 are positioned at the top wall 153. However, it should be appreciated that many variations and modifications can be made to embodiments of the disclosure. The number of ventilation units and the position of the ventilation units can be varied according to heat exchanger design. In some embodiments, the second chamber 15 includes only one ventilation unit 154.

In some embodiments, the second chamber 15 also includes an exhaust port 156. The exhaust port 156 is configured to remove air or gas from the interior 150 of the second chamber 15. In some embodiments, the exhaust port 156 is positioned at the side wall 152 and is fluidly connected to a gas handling apparatus 3. The gas handling apparatus 3 produces a vacuum pressure, such that the gas or air from the interior 150 of the second chamber 15 is driven toward the gas handling apparatus 3. In some embodiments, a control member 157 is mounted in the exhaust port 156. The control member 157 may include throttle valves. By adjusting the angle of a valve member on the throttle valve through the proper means such as a motor, the amount of exhaust flowing from the interior 150 of the second chamber 15 is regulated.

The fan assembly 16 is configured to create a flow of the heat-exchange medium into the interior 150 of the second chamber 15. In some embodiments, the fan assembly 16 is positioned at the side wall 151. The fan assembly 16 may include an impeller 161 and a motor (not shown in figures) to actuate the rotation of the impeller 161.

It should be appreciated that, while in the embodiment shown in FIG. 1, the exhaust port 156 and the fan assembly 16 are respectively located at two opposite side walls 151 and 152 of the second chamber 15, the disclosure should not be limited thereto. In some embodiments, the exhaust port 156 and the fan assembly 16 are respectively located at two neighboring side walls of the second chamber 15. In some embodiments, the fan assembly 16 is omitted.

Figure 2:
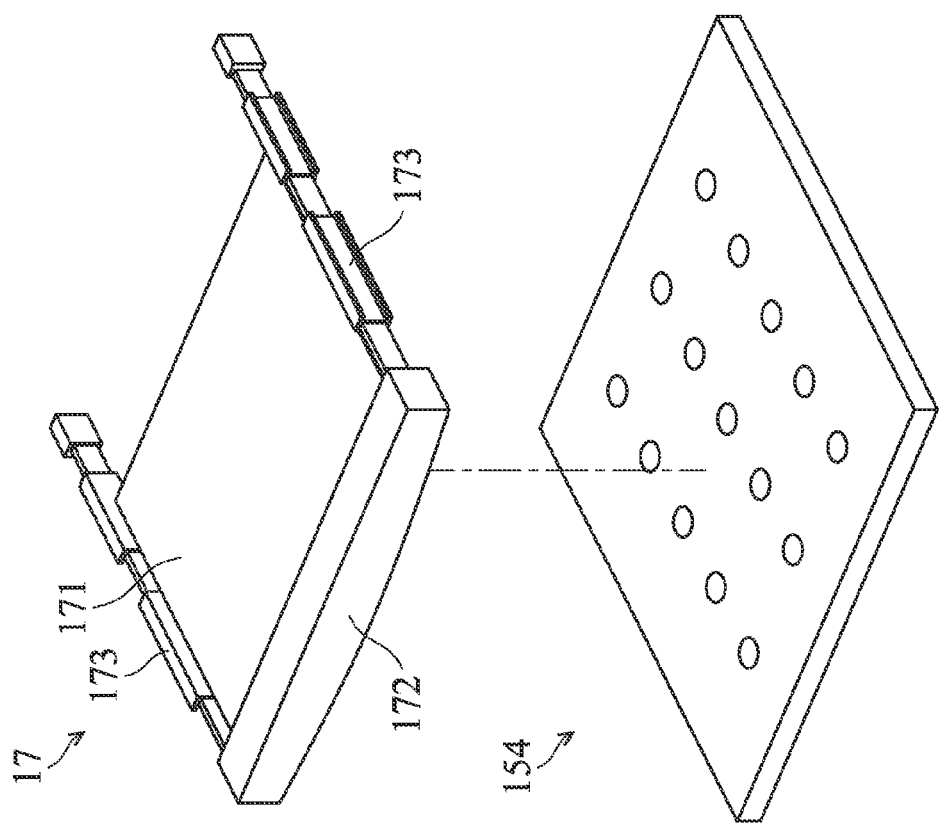
FIG. 2 is a schematic diagram of a covering module of a processing apparatus, in accordance with some embodiments.

The covering modules 17 are mounted corresponding to the ventilation units 154 and 155. As shown in FIG. 2, in some embodiments, each of the covering modules 17 includes a covering member 171 and a driving means 172, such a motor, to actuate the covering member 171. The covering member 171 may be made of a material selected from a group including PTFE, glass, and film. In some embodiments, each of the covering modules 17 further includes two rails 173 to guide the movement of the covering member 171. In some embodiments, the covering members 171 are able to completely close the corresponding ventilation units 154 and 155. When the ventilation units 154 and 155 are completely covered by the covering members 171, no gas or air, or a minimal amount, is allowed to enter the interior 150 of the second chamber 15.

Referring to FIG. 1, the process controller 18 is configured to control various parameters such as gas flow rate, pressure, chamber temperature, power, and radio frequency to generate a plasma. These parameters can vary depending on the type of etching process that is required for a particular application. In some embodiments, the controller 18 is provided for reading the temperature from the thermocouple probe 14 and controlling the covering modules 17.

The semiconductor wafer 5 may be made of silicon or other semiconductor materials. Alternatively or additionally, the semiconductor wafer 5 may include other elementary semiconductor materials such as germanium (Ge). In some embodiments, the semiconductor wafer 5 is made of a compound semiconductor such as silicon carbide (SiC), gallium arsenic (GaAs), indium arsenide (InAs), or indium phosphide (InP). In some embodiments, the semiconductor wafer 5 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 5 includes an epitaxial layer. For example, the semiconductor wafer 5 has an epitaxial layer overlying a bulk semiconductor. In some other embodiments, the semiconductor wafer 5 may be a silicon-on-insulator (SOI) or a germanium-on-insulator (GOI) substrate.

The semiconductor wafer 5 may have various device elements. Examples of device elements that are formed in the semiconductor wafer 5 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

Figure 3:
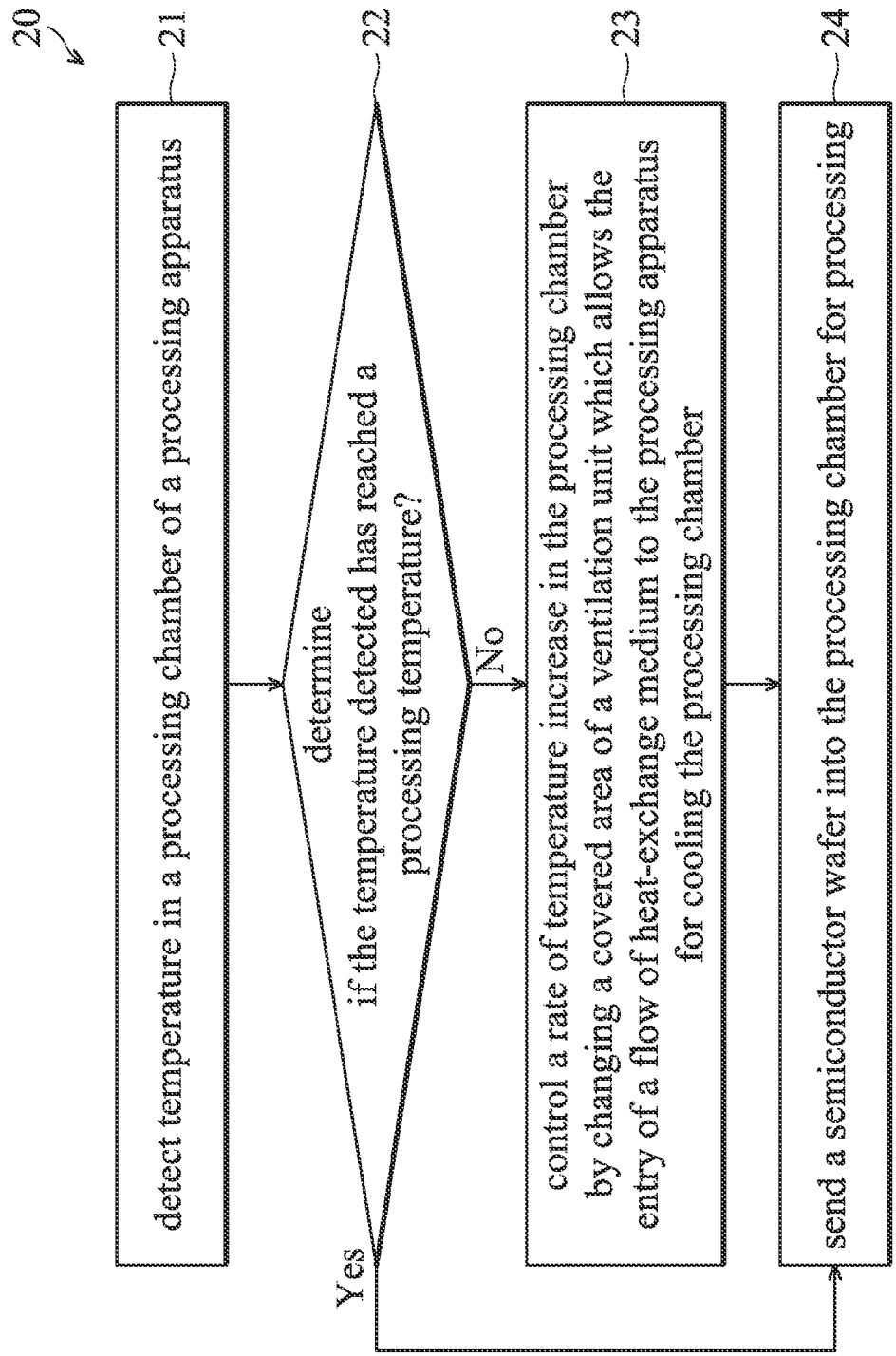
FIG. 3 is a flow chart of methods for processing a semiconductor wafer, in accordance with some embodiments.

FIG. 3 is a flow chart illustrating a method 20 for processing at least one semiconductor wafer 5 under a controlled processing temperature, in accordance with some embodiments. For illustration, the flow chart will be described along with the schematic diagrams shown in FIGS. 1, 3, and 4. Some of the stages described can be replaced or eliminated for different embodiments. Additional features can be added to the semiconductor device structure. Some of the features described below can be replaced or eliminated for different embodiments.

In some embodiments, heat is produced during the processing of the semiconductor wafer 5 and causes the temperature of the processing apparatus 1 to rise. The increasing temperature may adversely affect the result of the semiconductor wafer 5 processing. According to experimental results, in a plasma etching process conducted on a TEOS layer, every 1° C. temperature increase results in an increase in the etching rate per minute of about 0.7 A. Moreover, in a plasma etching process conducted on a poly layer, every 1° C. temperature increase results in an increase in the etching rate per minute of about 1.96 A. As a result, the lack of precise control over the processing temperature in the plasma etcher leads to severe processing difficulties and produces a low yield of wafers.

To overcome the problem mentioned above, the method 20 to control processing temperature in semiconductor fabrication is provided. In some embodiments, the method 20 begins with an operation 21 in which the temperature of a processing chamber (such as first chamber 11 of processing apparatus 1) is detected before the processing of the semiconductor wafer 5.

The temperature of the first chamber 11 is detected by the thermocouple probe 14. In some embodiments, the temperature of the TCP window 112 of the first chamber 11 is detected. Since the temperature at the TCP window 112 reflects the effective temperature in the first chamber 11, monitoring the temperature of TCP window 112 aids understanding of how the semiconductor wafer 5 is treated in the process. Therefore, many semiconductor wafers 5 can be saved to reduce the cost. However, it should be appreciated that many variations and modifications can be made to embodiments of the disclosure. In other embodiments, the temperature of the side walls 111 or the bottom wall 113 is detected. In some embodiments, the thermocouple probe 14 uses an infrared sensing camera mounted through the dielectric window 112 for detecting the temperature of the top surface of the wafer holding state 12.

The temperature of the first chamber 11 can be monitored at any time including during the processing of the semiconductor wafer 5, before the processing of the semiconductor wafer 5, or after the processing of the semiconductor wafer 5. In some embodiments, the temperature of the first chamber 11 is detected before the semiconductor wafer 5 is sent into the first chamber 11 and the temperature detection stops when the semiconductor wafer 5 is sent into the first chamber 11.

The method 20 continues to an operation 22 in which an analysis is performed to determine if the temperature detected in the first chamber 11 is equal to a processing temperature. In some embodiments, the detected signal from the thermocouple probe 14 is transmitted to a controller 18, and the controller 18 compares the detected signal to a pre-stored value to determine if the temperature detected in the first chamber 11 has reached the processing temperature.

In some embodiments, the processing temperature is a particular temperature value. Alternatively, the processing temperature is within a temperature range. If the detected temperature is within a temperature range, the controller 18 determines that the detected temperature has reached the processing temperature. If the detected temperature exceeds the temperature range, the controller 18 determines that the detected temperature has not reached the processing temperature. In some embodiments, the temperature detected in the first chamber 11 may be higher or lower than a preset temperature value by about 2° C. to about 4° C. The temperature range is selected so that the semiconductor wafer 5 can be processed within the temperature range without significantly affecting the processing result.

The method 20 continues with operation 23, in which the rate of temperature increase in the first chamber 11 is controlled. In some embodiments, the rate of temperature increase is controlled by regulating the flow of the heat-exchange medium in the second chamber 15 so as to dissipate the heat produced in the first chamber 11.

Figure 4:
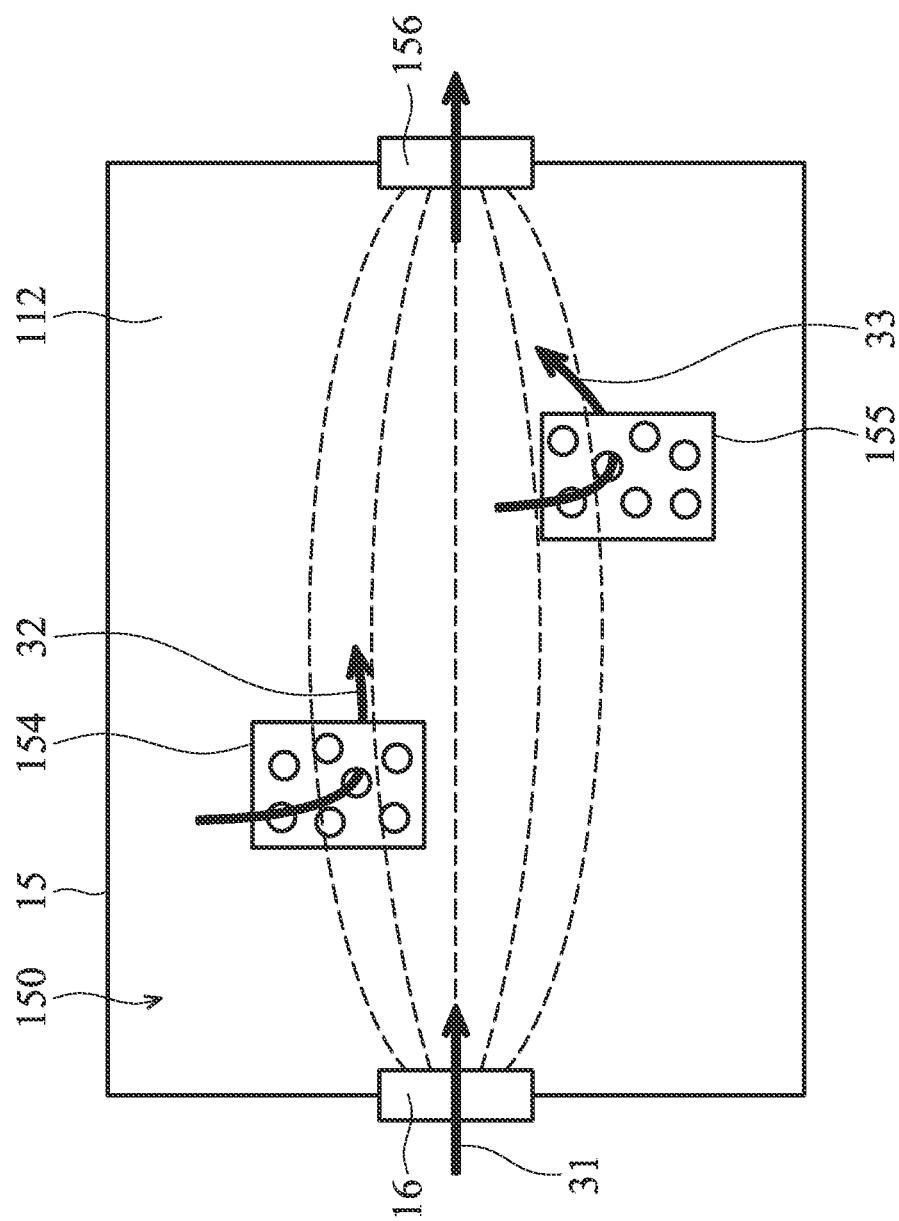
FIG. 4. is a schematic diagram illustrating the flow field of a heat-exchange medium in a second chamber of a processing apparatus with fully opened air-admission units, in accordance with some embodiments.

Referring to FIG. 4, to control the temperature of the first chamber 11, a flow of heat-exchange medium is generated in the second chamber 15. In some embodiments, a portion of the flow 31 of the heat-exchange medium flows into the interior 150 via the fan assembly 16. In addition, another portion of the flows 32 and 33 of the heat-exchange medium flows into the interior 150 via the ventilation units 154 and 155. The flows 32 and 33 of the heat-exchange medium from the ventilation units 154 and 155 may be passively guided into the interior 150 by the vacuum pressure produced by the gas handling apparatus 3. The heat-exchange medium may be air outside of the second chamber 15 or a cooling gas, such as helium cooling gas. When the heat-exchange medium passes through the second chamber 15, the heat is took away from the first chamber 11, and the first chamber 11 is cooled down to a lower temperature.

The details for regulating the flow of the heat-exchange medium in the second chamber 15 in accordance with some embodiments are described below.

In some embodiments, the flow of the heat-exchange medium is regulated by changing the covered area of the ventilation units 154 and 155 by use of the covering modules 17.

For example, when the temperature detected in the first chamber 11 is lower than the processing temperature, a higher rate of temperature increase in the first chamber 11 is desired. To increase the rate of temperature increase, as shown in FIG. 4, at least one of the covering modules 17 is controlled to fully open the corresponding ventilation units 154 and 155, so as to allow as much gas or air as possible to flow into the interior 150. Since the flow 31 from the fan assembly 16 is immediately converged with the flow 32 and 33 from the ventilation units 154 and 155 and removed by the exhaust port 156, only minimal heat from the TCP window 112 is taken away. The temperature of the first chamber 11 is therefore increased after the plasma etching process.

Figure 5:
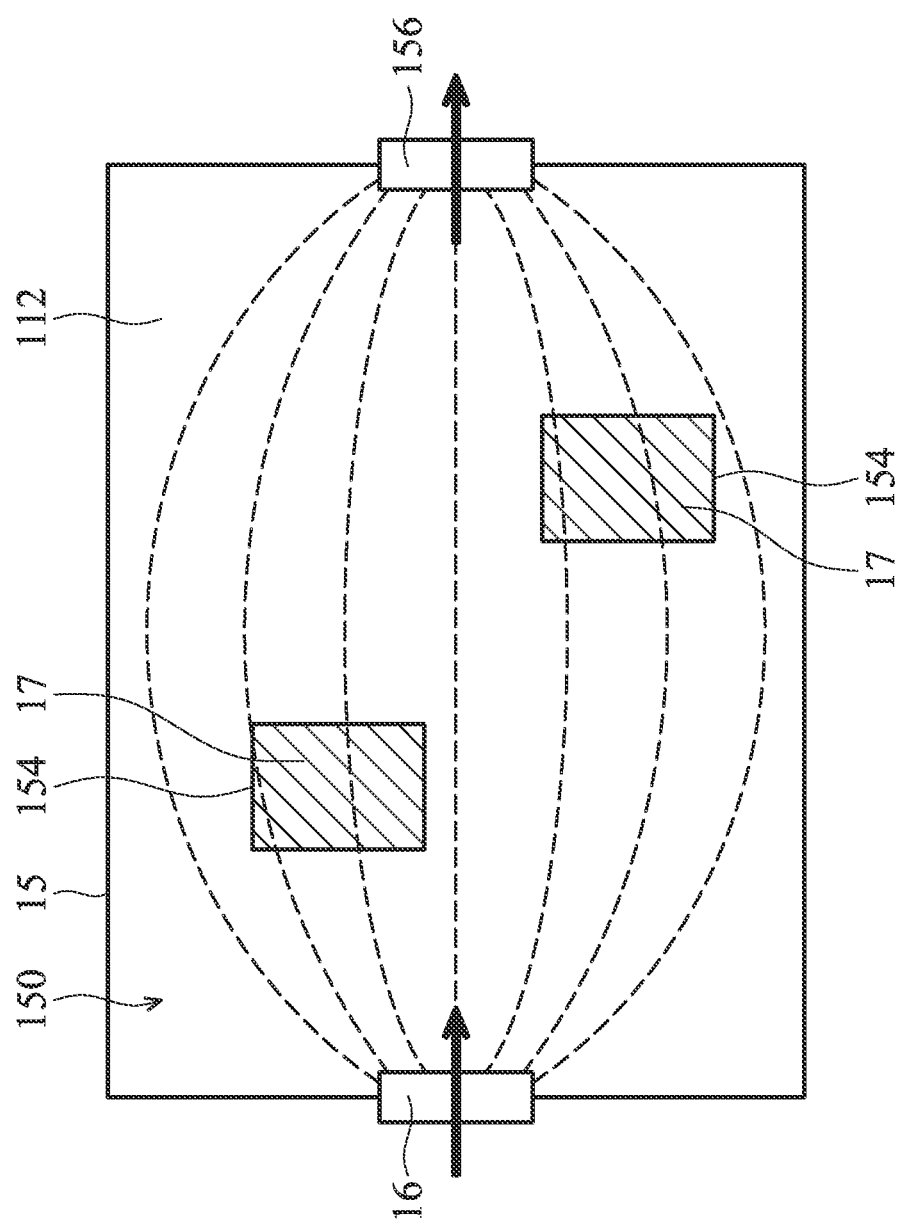
FIG. 5 is a schematic diagram illustrating the flow field of a heat-exchange medium in the second chamber of a processing apparatus with fully closed air-admission units, in accordance with some embodiments.

Conversely, when the temperature detected in the first chamber 11 is higher than the processing temperature, a lower rate of temperature increase in the first chamber 11 is desired. To decrease the rate of temperature increase, as shown in FIG. 5, at least one of the covering modules 17 is controlled to fully close the corresponding ventilation units 154 and 155, so as to allow no gas or air or a minimal amount gas or air to flow into the interior 150. Since the flow 31 from the fan assembly 16 is uniformly spread in the interior 150 and stays in the interior 150 for a longer time before being removed by the exhaust port 156, more heat from the TCP window 112 is taken away. The temperature of the first chamber 11 is therefore decreased.

It should be noted that the covering modules 17 can be controlled independently, so that the covered area of the ventilation units 154 and 155 can be different. For example, 50% of the area of ventilation unit 154 is covered by the corresponding covering modules 17, and 25% of the area of ventilation unit 155 is covered by another corresponding covering modules 17.

Figure 6:
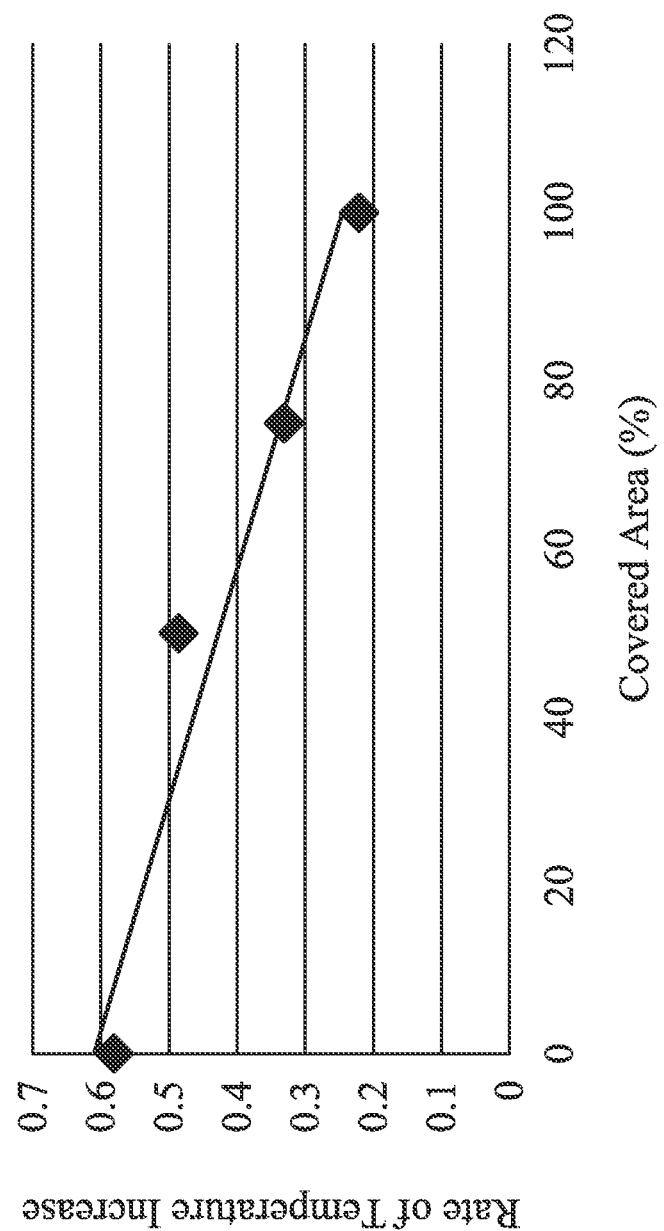
FIG. 6 is a graph showing the covered area of a ventilation unit against rate of temperature increase, in accordance with some embodiments.

FIG. 6 is a graph showing the covered area of a ventilation unit against the rate of temperature increase, in accordance with some embodiments. As can be seen, the rate of temperature increase of the first chamber 11 gradually drops with the increase of the covered area of the ventilation units 154 and 155.

In some embodiments, as the number of semiconductor wafers 5 processed by the processing apparatus 1 increase, the rate of temperature increase of the first chamber 11 gradually rises. To control the temperature of the first chamber 11 so that it does not exceed a temperature range, the covered area of the ventilation units 154 and 155 is changed dynamically according to the detected temperature.

For example, the covered area of each of the ventilation units 154 and 155 during the processing of the previous semiconductor wafer 5 is greater than the covered area of the ventilation units 154 and 155 during the processing of the current semiconductor wafer 5. As a result, the rate of temperature increase of the first chamber 11 is constrained, and the temperature of the first chamber 11 is controlled so that it remains within the temperature range.

In some embodiments, the flow of the heat-exchange medium is regulated by changing the amount of exhaust. In some embodiments, the exhaust flow is adjusted by changing the vacuum pressure produced by the gas handling apparatus 3. With a higher vacuum pressure, a higher rate of temperature increase in the first chamber 11 is established, and vice versa. Alternatively, the amount of exhaust can be adjusted by changing the positioning angle of the control member 157 mounted in the exhaust port 156. With a large opening ratio of the control member 157, more gas or air can be removed from the interior 150, and the rate of temperature increase of the first chamber 11 is therefore increased, and vice versa.

In some embodiments, the flow of the heat-exchange medium is regulated by adjusting the power of the fan assembly 16. When the fan assembly 16 is actuated with higher power, more flow is driven to dissipate the heat from the interior 150, and the rate of temperature increase of the first chamber 11 is therefore decreased.

In some embodiments, the operation of 23 is controlled by a real-time signal from the controller 18 according to the temperature detected. In some embodiments, the controller 18 receives a signal from the optical sensor thermocouple probe 14 and compares the signal to a pre-stored value, and then sends out a signal to the covering modules 17, the control member 157, the gas handling apparatus 3, or the fan assembly 16 to either increase or decrease the flow of the heat-exchange medium.

It should be appreciated that the method for regulating the flow of heat-exchange medium mentioned above can be used together so as to set a desired processing temperature of the TCP window 112 of the first chamber 11 or the average temperature of the first chamber 11.

Figure 7:
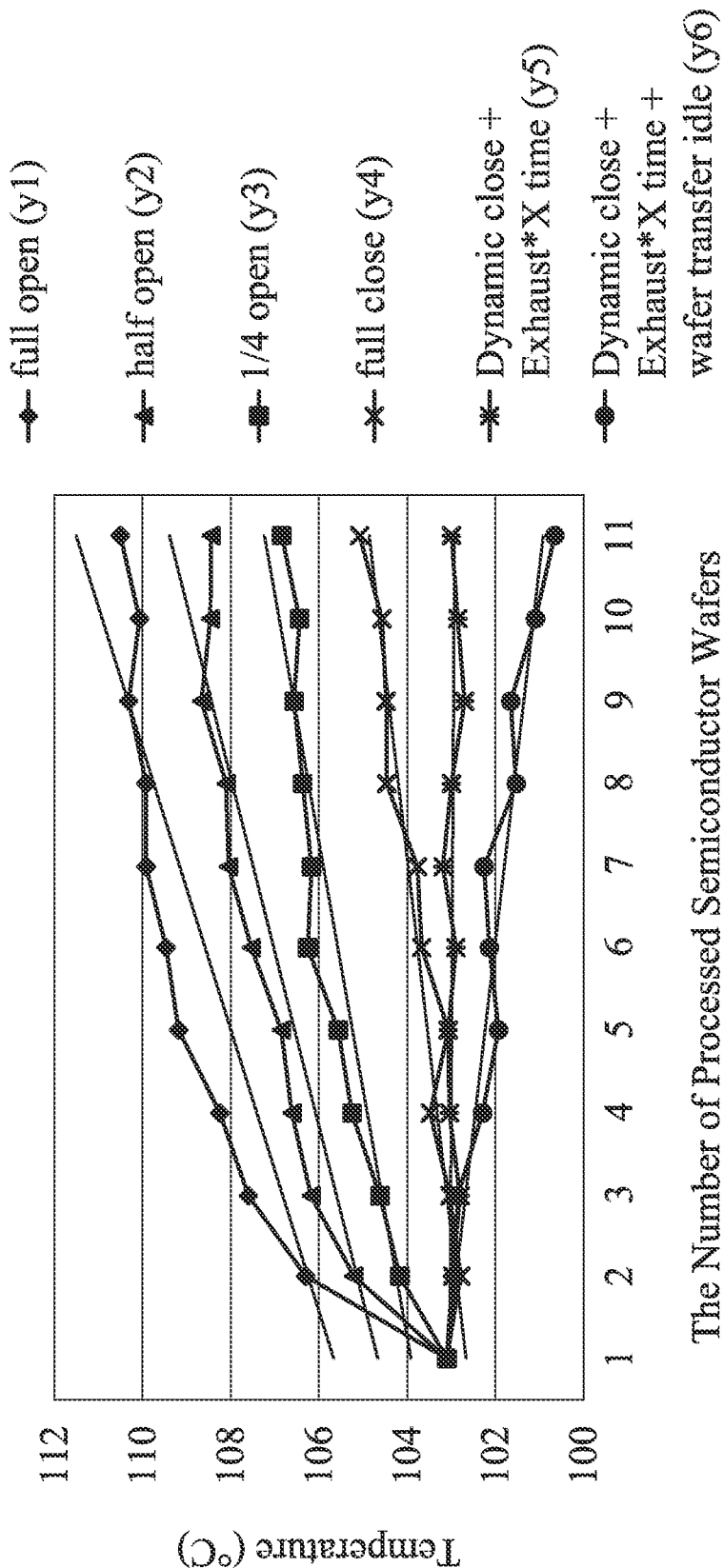
FIG. 7 is a graph showing the effectiveness of a processing apparatus for controlling temperature wherein the temperature of the TCP window in different control methods y1 to y6 are plotted against the number of semiconductor wafers having been processed, in accordance with some embodiments.

For example, as shown in FIG. 7, the line y5 indicates temperature of TCP window 112 which is cooled by two different methods. One of the methods includes dynamically adjusting the covered area of the ventilation units 154 and 155. The other method includes dynamically adjusting the exhaust removed from the interior 150, where the exhaust is adjusted with an amount that is X times of the amount of the original exhaust. After a number of semiconductor wafers 5 are processed by the first chamber 11, the temperature of the TCP window 112 is maintained at a substantially constant temperature. As a result, a thermostatic first chamber 11 is realized without additional expensive equipment to heat or cool the first chamber 11.

The method 20 continues with operation 24, in which the semiconductor wafer 5 is sent into the first chamber 11 and processed by the first chamber 11 when the temperature detected has reached the processing temperature. In some embodiments, the semiconductor wafer 5 is loaded into the first chamber 11 just in time, and the semiconductor wafer 5 is processed immediately at the correct processing temperature. Therefore, the throughput of the semiconductor wafer 5 is increased.

In some embodiments, the semiconductor wafer 5 is continuously sent into the first chamber 11 for processing after the removal of the previously processed semiconductor wafer 5. At the same time, the rate of temperature increase of the first chamber 11 is maintained constant. In this case, while the same slot of semiconductor wafer 5 may be etching in different temperature, the processing results are within an acceptable range.

In some embodiments, the rate of temperature increase in the first chamber 11 is maximized (e.g., fully closing the first ventilation unit and maximize the exhaust vacuum pressure). However, the temperature of the first chamber 11 still higher than a desired temperature. In this case, a transfer idle time is set during the removal of the semiconductor wafer 5 from the first chamber 11 and the loading of the next semiconductor wafer 5. During the transfer idle time, the semiconductor wafer stays outside of the first chamber 11 to wait until the temperature detected in the first chamber has reached a desire temperature.

As shown in FIG. 7, the line y6 indicates temperature of TCP window 112 which is cooled by three different methods simultaneously. In addition to the two method used for the slot of semiconductor wafer 5 indicated in line y5, a transfer idle time is set semiconductor wafer 5 before the loading of each semiconductor wafer 5 into the first chamber 11. As can be seen, after a number of semiconductor wafers 5 are processed by the first chamber 11, the temperature of the TCP window 112 is slightly decreased. As a result, a failure of the element in the semiconductor wafer 5 due to high temperature can be prevented.

In some embodiments, a plasma etching process is performed over the semiconductor wafer 5 in the first chamber 11. During the plasma etching process, the semiconductor wafer 5 is secured on the wafer holding stage 12. The semiconductor wafer 5 typically includes a patterned photoresist layer that is ready for a plasma process such as a high-density plasma etching process.

In some embodiments, the inductive coil 13 is energized by the RF power source and generates an electric field (not shown). The electric field causes dissociation of the gas into ions, radicals, and electrons. The energized electrons are accelerated by the electric field and strike gas molecules which cause the gas molecules to be ionized (e.g., free electrons). This process continues and eventually the plasma becomes self-sustaining within the first chamber 11.

In some embodiments, the semiconductor wafer 5 is voltage-biased via the wafer holding stage 12 which is coupled to the RF power source. Accordingly, the ions contained in the plasma are directed towards the semiconductor wafer 5 at a substantially right angle such that highly anisotropic etching can be achieved on the unprotected portions of the semiconductor wafer 5.

It is should be appreciated that the first chamber 11 can be replaced by other processing chamber which performs other process rather than plasma etching. Any apparatus which utilizes a flow of heat-exchange medium to control the temperature of the processing chamber is within the spirit and scope of the embodiments.

Embodiments of mechanisms for controlling processing temperature of a processing apparatus in semiconductor fabrication are provided. The covered area for of a ventilation unit which allows the entry of a heat-exchange medium for cooling is adjustable. As a result, the rate of temperature increase in the process chamber can be controlled dynamically and actively. The semiconductor wafers are processed properly, and with better uniformity. In addition, by controlling the flow of the heat exchange medium in the apparatus, a thermostatic processing chamber can be realized without equipping the processing apparatus with thermostatic parts. The cost of manufacturing is therefore reduced.

In accordance with some embodiments, the disclosure provides a method for controlling processing temperature in semiconductor fabrication. The method includes detecting temperature in a first chamber configured to process a semiconductor wafer. The method further includes detecting temperature in a first chamber configured to process a semiconductor wafer. The method also includes controlling the flow of heat-exchange medium according to the temperature detected in the first chamber. The flow is controlled by changing a covered area of a first ventilation unit which allows the entry of the heat-exchange medium to the second chamber.

In accordance with some embodiments, the disclosure provides a method for processing a semiconductor wafer. The method includes detecting temperature in a first chamber of a processing apparatus which is configured to process the semiconductor wafer. The method further includes determining if the temperature detected in the first chamber has reached a processing temperature. If the temperature detected in the first chamber has not reached a processing temperature, a rate of temperature increase in the first chamber is controlled by changing a covered area of a first ventilation unit. The first ventilation unit allows the entry of a flow of heat-exchange medium to the processing apparatus for cooling the first chamber. If the temperature detected in the first chamber has reached a processing temperature, the semiconductor wafer is sent into the first chamber for processing.

In accordance with some embodiments, the disclosure provides a processing apparatus for processing at least one semiconductor wafer. The processing apparatus includes a first chamber and a second chamber. The first chamber is used to process the semiconductor wafer. The second chamber is connected to the first chamber. The second chamber includes a ventilation unit used to allow heat-exchange medium to enter the second chamber and an exhaust port used to remove heat-exchange medium from the second chamber. The processing apparatus further includes a fan assembly, configured to drive a flow of heat-exchange medium into the second chamber. The processing apparatus also includes a covering module configured to change a covered area of the ventilation unit.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for controlling processing temperature in semiconductor fabrication, comprising:
   detecting temperature in a first chamber configured to process a semiconductor wafer;
   creating a flow of heat-exchange medium in a second chamber which is connected to the first chamber to cool the first chamber; and
   controlling the flow of heat-exchange medium according to the temperature detected in the first chamber by changing a covered area of a first ventilation unit which allows the entry of the heat-exchange medium to the second chamber.

2. The method as claimed in claim 1, wherein controlling the flow of heat-exchange medium comprises decreasing the covered area of the first ventilation unit if the temperature detected in the first chamber is higher than a processing temperature.

3. The method as claimed in claim 1, wherein controlling the flow of heat-exchange medium comprises increasing the covered area of the first ventilation unit if the temperature detected in the first chamber is lower than a processing temperature.

4. The method as claimed in claim 1, wherein creating a flow of heat-exchange medium in a second chamber comprises producing a vacuum pressure to drive the flow of heat-exchange medium flowing out of the second chamber, and the method further comprises:
   controlling the flow of heat-exchange medium according to the temperature detected in the first chamber by changing the vacuum pressure.

5. The method as claimed in claim 1, wherein creating a flow of heat-exchange medium in a second chamber comprises using a fan assembly to direct heat-exchange medium into the second chamber.

6. The method as claimed in claim 1, further comprising controlling the flow of heat-exchange medium flowing into the second chamber by changing a covered area of a second ventilation unit which allows the entry of the heat-exchange medium to the second chamber, wherein the covered area of the first ventilation unit is different from the covered area of the second ventilation unit.

7. The method as claimed in claim 1, wherein changing a covered area of a first ventilation unit comprises using a covering module to cover a portion of the first ventilation unit.

8. A method for processing at least one semiconductor wafer, comprising:
   detecting temperature in a first chamber of a processing apparatus which is configured to process the semiconductor wafer;
   determining if the temperature detected in the first chamber has reached a processing temperature;
   controlling a rate of temperature increase in the first chamber by changing a covered area of a first ventilation unit which allows the entry of a flow of heat-exchange medium to the processing apparatus for cooling the first chamber if the temperature detected in the first chamber has not reached a processing temperature;
   sending the semiconductor wafer into the first chamber for processing if the temperature detected in the first chamber has reached a processing temperature.

9. The method as claimed in claim 8, wherein changing a covered area of a first ventilation unit comprises decreasing the covered area of the first ventilation unit if the temperature detected in the first chamber is higher than the processing temperature.

10. The method as claimed in claim 8, wherein changing a covered area of a first ventilation unit comprises increasing the covered area of the first ventilation unit if the temperature detected in the first chamber is lower than a processing temperature.

11. The method as claimed in claim 8, wherein controlling a rate of temperature increase in the first chamber comprises creating a vacuum pressure to drive the flow of heat-exchange medium flowing out of the processing apparatus and changing the vacuum pressure according to the temperature detected in the first chamber.

12. The method as claimed in claim 8, wherein controlling a rate of temperature increase in the first chamber comprises changing a covered area of a second ventilation unit which allows the entry of a flow of heat-exchange medium to the processing apparatus for cooling the first chamber.

13. The method as claimed in claim 12, wherein the covered area of the first ventilation unit is different from the covered area of the second ventilation unit.

14. The method as claimed in claim 8, wherein changing a covered area of a first ventilation unit comprises using a covering module to cover a portion of the first ventilation unit.

15. The method as claimed in claim 8, further comprising keeping the semiconductor wafer outside of the first chamber for a time period to wait until the temperature detected in the first chamber has reached the processing temperature.

16. The method as claimed in claim 8, further comprising continuously sending another semiconductor wafer into the first chamber for processing after the removal of the processed semiconductor wafer.

17. The method as claimed in claim 8, wherein the first chamber is configured to perform a plasma etching process over the semiconductor wafer.

18. A processing apparatus for processing at least one semiconductor wafer, comprising:
   a first chamber configured to process the semiconductor wafer;
   a second chamber connected to the first chamber and comprising:
      a ventilation unit configured to allow heat-exchange medium to enter the second chamber; and
      an exhaust port configured to remove heat-exchange medium from the second chamber;
   a fan assembly configured to drive a flow of heat-exchange medium into the second chamber; and
   a covering module configured to change a covered area of the ventilation unit.

19. The apparatus as claimed in claim 18, further comprising a plurality of covering modules, wherein the second chamber comprises a plurality of ventilation units, and the covered area of each ventilation unit is independently controlled by the corresponding covering module.

20. The apparatus as claimed in claim 18, further comprising a thermocouple probe configured to detect temperature in the first chamber, and the covered area is changed by the covering module according to the temperature detected in the first member.

* * * * *